United States Patent [19]

Pham

[11] Patent Number: 5,736,879
[45] Date of Patent: Apr. 7, 1998

[54] CLOSED-LOOP FREQUENCY-TO-CURRENT CONVERTER WITH INTEGRABLE CAPACITANCES

[75] Inventor: Giao Minh Pham, Milpitas, Calif.

[73] Assignee: Siliconix incorporated, Santa Clara, Calif.

[21] Appl. No.: 594,676

[22] Filed: Feb. 2, 1996

[51] Int. Cl.⁶ ............................................. H03D 3/00
[52] U.S. Cl. ..................... 327/102; 327/95; 327/103; 327/132; 327/137
[58] Field of Search ............................ 327/102, 103, 327/91, 94, 100, 131, 132, 134, 137, 140, 124, 536, 95, 96; 330/9; 324/76.69

[56] References Cited

U.S. PATENT DOCUMENTS

| | | | |
|---|---|---|---|
| 4,215,315 | 7/1980 | Lambert et al. | 327/102 |
| 4,225,796 | 9/1980 | Makino et al. | 327/102 |
| 4,250,435 | 2/1981 | Alley et al. | 318/138 |
| 4,275,343 | 6/1981 | Fulton et al. | 318/721 |
| 4,394,610 | 7/1983 | Dolland | 318/803 |
| 4,401,934 | 8/1983 | Dolland et al. | 318/798 |
| 4,455,513 | 6/1984 | Fulton et al. | 318/138 |
| 4,513,230 | 4/1985 | Erdman | 318/254 |
| 4,540,906 | 9/1985 | Blom | 310/67 R |
| 4,575,652 | 3/1986 | Gogue | 310/49 R |
| 4,642,537 | 2/1987 | Young | 318/254 |
| 4,656,400 | 4/1987 | Pailthorp et al. | 318/135 |
| 4,659,969 | 4/1987 | Stupak, Jr. | 318/128 |
| 4,665,348 | 5/1987 | Stupak, Jr. | 318/135 |
| 4,673,849 | 6/1987 | Sears et al. | 318/272 |
| 4,743,815 | 5/1988 | Gee et al. | 318/254 |
| 4,751,459 | 6/1988 | Stupak, Jr. | 324/164 |
| 4,757,241 | 7/1988 | Young | 318/254 |
| 4,774,428 | 9/1988 | Konecny | 310/198 |
| 4,823,091 | 4/1989 | Moreau | 327/102 |
| 5,015,939 | 5/1991 | Konecny | 318/701 |
| 5,034,668 | 7/1991 | Bausch | 318/254 |
| 5,196,741 | 3/1993 | Rustici | 327/91 |
| 5,258,695 | 11/1993 | Utenick et al. | 318/138 |
| 5,272,803 | 12/1993 | Harrison et al. | 29/596 |

OTHER PUBLICATIONS

"Brushless DC Motor Drive Circuit", Development Data TDA5140, Philips, Jan. 1989.

*Primary Examiner*—Timothy P. Callahan
*Assistant Examiner*—Kenneth B. Wells
*Attorney, Agent, or Firm*—Skjerven, Morrill MacPherson, Franklin & Friel; David E. Steuber

[57] ABSTRACT

A frequency-to-current converter includes several capacitances with capacitive values that are effectively multiplied. After each of a series of periodic pulses, the voltage on a "ramp" capacitance is charged to a starting voltage. Then, during the period preceding the subsequent pulse, the ramp capacitance is allowed to discharge at a discharge rate that is a function of a voltage on a discharge-current bias capacitance. At the end of the period, the voltage on the ramp capacitance is sampled and compared to a reference. If the voltage on the ramp capacitance is too low or too high, indicating a discharge current that is too high or too low, respectively, the bias voltage on the bias capacitance is adjusted to compensate for the error. In another embodiment, a small ramp capacitance is repetitively charged and discharged between two reference voltage levels using alternating charge and discharge current levels. The charge and discharge current levels are related to output current levels so that the rate at which the ramp capacitance transitions between the two reference voltages provides an indication of the output current.

17 Claims, 9 Drawing Sheets

5,736,879

CLOSED-LOOP FREQUENCY-TO-CURRENT CONVERTER WITH INTEGRABLE CAPACITANCES

CROSS-REFERENCE TO RELATED APPLICATIONS

The present application is related to application Ser. No. 08/595,812, filed herewith, entitled "Commutation Delay Generator For Multiphase Brushless DC Motor," by Giao M. Pham, Barry J. Concklin, and James H. Nguyen, which is incorporated herein by this reference.

BACKGROUND

1. Field of the Invention

This invention relates generally to frequency-to-voltage and frequency-to-current converters.

2. Description of Related Technology

Frequency-to-current converters are typically implemented by combining a frequency-to-voltage converter and a voltage-to-current converter. In a conventional frequency-to-voltage converter, a one-shot-controlled current reference is averaged by an integrating amplifier. The one-shot and the integrating amplifier each employ rather large capacitances that are difficult to integrate, and are therefore typically provided externally. The remaining circuitry may then be provided as one or more integrated circuits. Many conventional frequency-to-voltage converters are available, several of which are described in the 1994 *Applications Handbook* available from Burr-Brown of Tucson, Ariz.

An additional problem of conventional frequency-to-voltage converters results from a trade-off between ripple and settling time. High-resolution frequency-to-voltage converters demand low ripple, but decreasing the ripple increases settling time. In practice, the trade-off between settling time and ripple can be improved by filtering the frequency-to-voltage output with a low-pass filter. Unfortunately, such low-pass filters require some additional capacitance, making the frequency-to-voltage converter even more difficult to integrate. Finally, conventional frequency-to-current converters are typically open-loop systems. As such, conventional frequency-to-current converters are sensitive to external disturbances to the output, such as leakage current.

Because of the foregoing problems, there exists a need for a frequency-to-current converter that is insensitive to output disturbances, relies on matched component values to ensure accuracy, and makes use of relatively small, integrable, capacitances.

SUMMARY

The present invention addresses the aforementioned needs by providing a closed-loop frequency-to-current converter with integrable capacitances. To accomplish this, a frequency-to-current converter in accordance with the present invention includes several capacitances with capacitive values that are effectively multiplied using inventive capacitance-multiplication techniques.

One method in accordance with the invention allows for the conversion of a periodic series of input pulses to a proportional current without the use of an external capacitance. After each incoming pulse, the voltage on a "ramp" capacitance is reset to a starting voltage. Then, during the period preceding the subsequent pulse, the ramp capacitance is allowed to discharge at a rate that is controlled by a voltage stored across a discharge-current bias capacitance. Next, following the subsequent input pulse, the voltage on the ramp capacitance is sampled for a sample period that is short relative to the period of the pulse train.

During the sample period, the voltage on the ramp capacitance is compared to a fixed reference voltage. If the voltage on the ramp capacitance is lower than the fixed reference voltage, the discharge rate (and therefore the output current) is too high. Conversely, if the voltage on ramp capacitance is higher than the fixed reference voltage, the discharge rate is too low.

When the discharge rate of the ramp capacitance is determined to be either too low or too high, the stored voltage across the discharge-current bias capacitance is adjusted to compensate for the error. For example, if after one period of the input signal the voltage on the ramp capacitance is too high, the voltage on the bias capacitance is elevated to increase the discharge rate of the ramp capacitance for the next period. Once the comparison has been made and the voltage on the bias capacitance adjusted accordingly, the ramp capacitance is reset to the starting voltage and the cycle begins again.

As will be explained in detail below, the sampling technique is beneficial because the technique 1. allows for the use of a much smaller bias capacitance than would otherwise be required to provide a desired time constant,
2. allows a user to change the time constant of the bias capacitance without changing the value of the capacitance, and
3. eliminates the need to adjust the value of the bias capacitance for different input frequencies.

These benefits combined allow the bias capacitance to be integrated.

Another method in accordance with the invention, hereafter referred to as a "folding" technique, allows for the use of a relatively small ramp capacitance to establish the appropriate output current level. In accordance with this method, the small ramp capacitance is repetitively charged and discharged between two reference voltage levels using alternating charge and discharge current levels, each of which is a function of the output current level.

Because the charge and discharge current levels are related to the output current level, the rate at which the ramp capacitance is charged and discharged between the two reference voltages provides an indication of the output current. For example, if the output current is too high, the related charge and discharge currents will also be too high, resulting in relatively rapid charge and discharge rates. And, due to the rapid charge and discharge rates, the number of times the ramp capacitance will charge and discharge over a given period of time will increase in proportion to the increase in output current. Thus, a method in accordance with the invention includes the step of counting the number of times the ramp capacitance charges and discharges over a given period of time to determine whether to increase or decrease the output current.

The inventive folding technique allows for a significant reduction in the size of the ramp capacitance, thereby allowing the ramp capacitance to be easily integrated. Thus, in accordance with the present invention, both the bias capacitance and the ramp capacitance may be advantageously integrated with the other components of the frequency-to-current converter. Moreover, the inventive frequency-to-current converter design takes advantage of the exceptional device matching obtained using integrated circuit technology, as opposed to exact device values, to ensure accurate frequency-to-current conversion.

BRIEF DESCRIPTION OF THE FIGURES

These and other features, aspects, and advantages of the present invention will become understood with regard to the following description, appended claims, and accompanying drawings, where:

DETAILED DESCRIPTION

Figure 1:
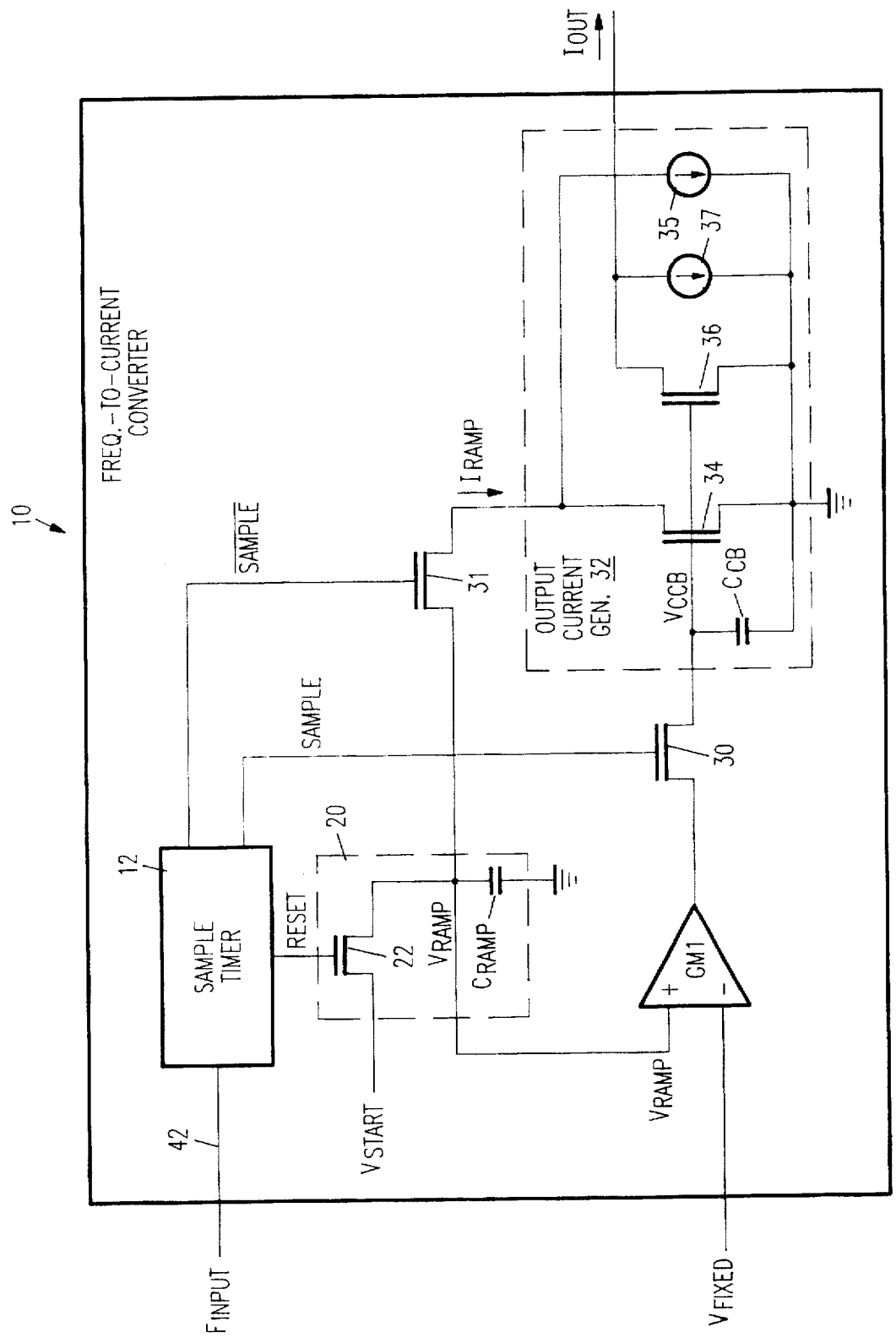
FIG. 1 shows a frequency-to-current converter 10 in accordance with one embodiment of the present invention.

FIG. 1 shows a frequency-to-current converter 10 in accordance with one embodiment of the present invention. Frequency-to-current converter 10 includes a sample timer 12, a ramp circuit 20, a differential transconductance amplifier GM1, a first sample gate 30, a second sample gate 31, and an output current generator 32.

Sample timer 12 is connected to the gate of a transistor 22 within ramp circuit 20 via a reset line RESET, to the control gate of sample gate 30 via a line SAMPLE, and to the control gate of sample gate 31 via a line $\overline{\text{SAMPLE}}$. Depending on the voltage applied from sample timer 12 to the control terminal of transistor 22, transistor 22 transfers a reference voltage on a terminal $V_{START}$ to a terminal of a ramp capacitance $C_{RAMP}$ within ramp circuit 20.

The non-inverting (+) input of transconductance amplifier GM1 is connected to a line $V_{RAMP}$ shared by transistor 22, capacitance $C_{RAMP}$, and through sample gate 31 to an output of current generator 32. The inverting (−) terminal of transconductance amplifier GM1 is connected to a fixed reference voltage on terminal $V_{FIXED}$, and the output of transconductance amplifier GM1 is connected to a current-handling terminal of sample gate 30. The other current-handling terminal of sample gate 30 is connected to the control gates of transistors 34 and 36 in current generator 32, and to one terminal of a discharge-current bias capacitance $C_{CB}$.

Current generator 32 provides an output current $I_{OUT}$ that is proportional to the input frequency of an input signal on a terminal $F_{INPUT}$ and is therefore inversely proportional to the average period of the input signal on terminal $F_{INPUT}$. Stated mathematically.

$$I_{OUT} = \frac{\alpha}{T_{INPUT}} \quad (2)$$

where $T_{INPUT}$ is the average period of e.g. one hundred cycles of the input signal in terminal $F_{INPUT}$ and $\alpha$ is the gain factor of frequency-to-current converter 10.

In the circuit of FIG. 1, output current $I_{OUT}$ is negative (i.e., the current flows into current generator 32). Of course, current generator 32 may also be configured (e.g., using a conventional current mirror) to provide a positive output current $I_{OUT}$.

Conventional current sources 35 and 37 provide offset currents through transistors 34 and 36, respectively, so that frequency-to-current converter 10 provides some specified offset current when the signal on terminal $F_{INPUT}$ has a frequency of between zero Hz and some selected value. Current sources 35 and 37 each source the same level of current so that the ramp current $I_{RAMP}$ is equal to the output current $I_{OUT}$. Where desired, the offset current can be eliminated or set to zero.

Figure 2:
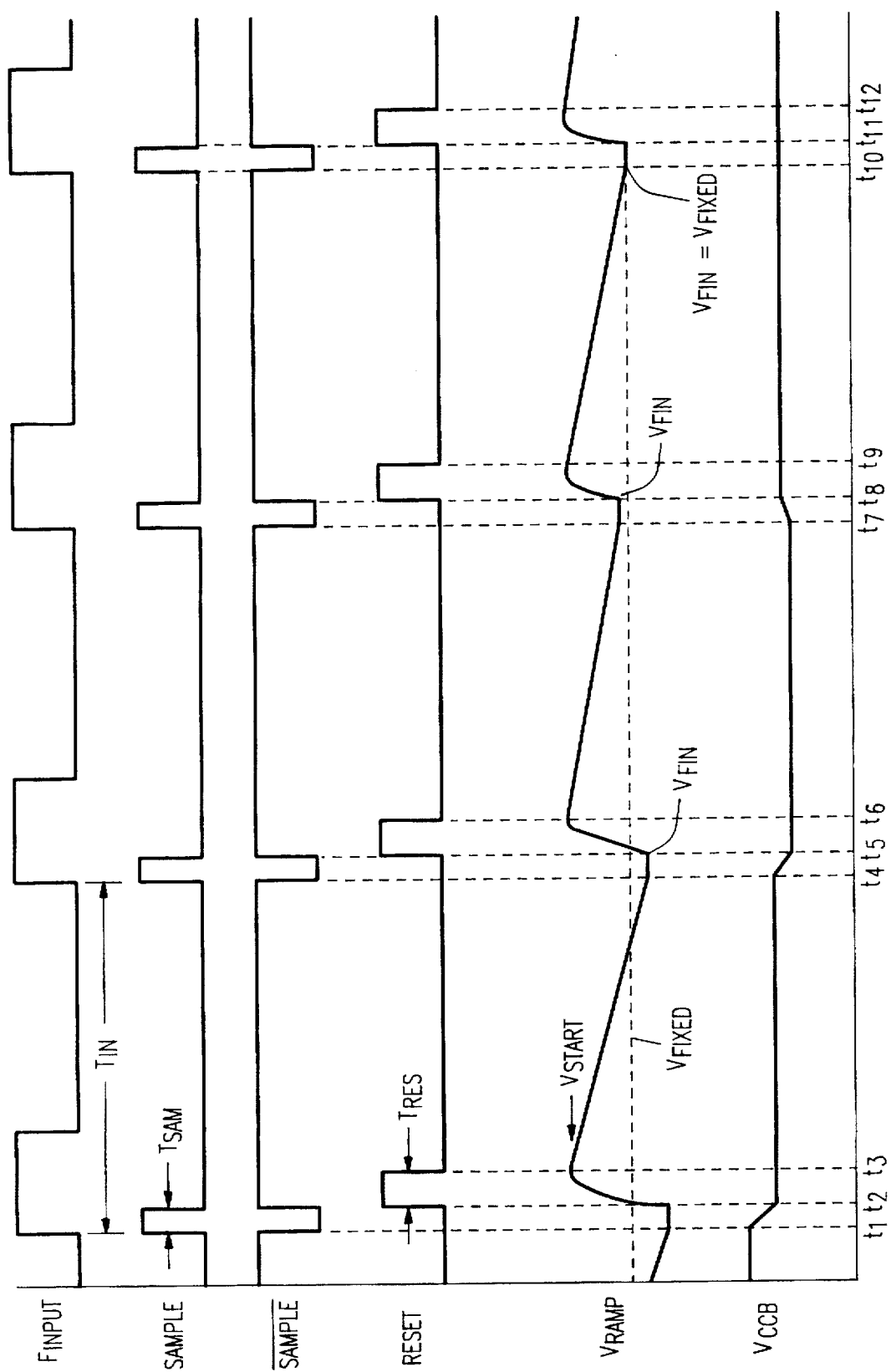
FIG. 2 shows various waveforms associated with frequency-to-current converter 10 of FIG. 1.

FIG. 2 shows various waveforms associated with frequency-to-current converter 10 of FIG. 1. The timing of the waveforms of FIG. 2 is not to scale. For example, the period $T_{INPUT}$ of the input signal on terminal $F_{INPUT}$ is, in one embodiment, 300 us as compared to the reset period $T_{RES}$ of 1 us and the sample period $T_{SAM}$ of from 100 ns to 800 ns. Sample timer 12 is a conventional timing circuit that, based on its function described herein, may easily be implemented by those of skill in the art.

Referring to the waveforms of FIG. 2 in conjunction with frequency-to-current converter 10 of FIG. 1, sample timer 12 outputs a sample pulse of period $T_{SAM}$ on line SAMPLE in response to an incoming pulse on terminal $F_{INPUT}$. The sample pulse on line SAMPLE turns on sample gate 30, thereby connecting the output of transconductance amplifier GM1 to a terminal of bias capacitance $C_{CB}$. During the sample period $T_{SAM}$, a logic zero on line $\overline{\text{SAMPLE}}$ turns gate 31 off so that the voltage on terminal $V_{RAMP}$ remains constant from e.g. time $t_1$ to time $t_2$.

During the sample period $T_{SAM}$ between times $t_1$ and $t_2$ the voltage on terminal $V_{RAMP}$ is less than the voltage on terminal $V_{FIXED}$. Thus, transconductance amplifier GM1 will draw charge away from capacitance $C_{CB}$, thereby decreasing the voltage on the gates of transistors 34 and 36. As a consequence, the current $I_{RAMP}$ through transistor 34 and the output current $I_{OUT}$ through transistor 36 will decrease.

Subsequent to the sample pulse, sample timer 12 outputs a reset pulse of period $T_{RES}$ to the gate of transistor 22 in ramp circuit 20. The reset pulse turns transistor 22 on, charging $C_{RAMP}$ to the reference voltage level on terminal $V_{START}$, as shown in FIG. 2 at time $t_3$.

Once the voltage on terminal $V_{RAMP}$ (and consequently across ramp capacitance $C_{RAMP}$) has been reset to the reference voltage on terminal $V_{START}$, ramp capacitance $C_{RAMP}$ will discharge through transistor 34 so that the voltage level on terminal $V_{RAMP}$ will decrease to a level $V_{FIN}$ at time $t_4$ when the next input pulse arrives on line 42. Because the voltage $V_{FIN}$ On line $V_{RAMP}$ is below the voltage on terminal $V_{FIXED}$, during the sample period from $t_4$ to $t_5$ transconductance amplifier GM1 will again draw charge away from bias capacitance $C_{CB}$, thereby decreasing the voltage on terminal $V_{CCB}$. This effect is shown in FIG. 2 as the decrease in the voltage $V_{CCB}$ that occurs during the second sample period (from $t_4$ and $t_5$). Having decreased the bias voltage on terminal $V_{CCB}$, the current through transistors 34 and 36 will also decrease. Thus, capacitance $C_{RAMP}$ will discharge more slowly than during the prior period, as evidenced by the decreased slope of the voltage on terminal $V_{RAMP}$ from time $t_6$ to time $T_8$.

When, as in the third sample period of FIG. 2 (from time $t_7$ to time $t_8$), the finish voltage $V_{FIN}$ on ramp capacitance $C_{RAMP}$ is greater than the voltage on terminal $V_{FIXED}$, transconductance amplifier GM1 will provide charge to bias capacitance $C_{CB}$ through sample gate 30 during the sample period $T_{SAM}$, as evidenced by the voltage increase on terminal $V_{CCB}$ from time $t_7$ to time $t_8$.

The above-described closed-loop feedback system will eventually cause the voltage on terminal $V_{RAMP}$ to go from the reference voltage on terminal $V_{START}$ to the reference voltage on terminal $V_{FIXED}$ in the period between input pulses. In other words, the voltage level $V_{FIN}$ for the voltage on terminal on $V_{RAMP}$ will equal the voltage level on terminal $V_{FIXED}$ during a sample period $T_{SAM}$. In such a case, virtually zero current will flow from the output of transconductance amplifier GM1 during the sample period $T_{SAM}$. This case is illustrated in FIG. 2 between time $t_{10}$ and time $t_{11}$.

It is important here, as with conventional feedback systems, that the time constant $\tau_{Ccb}$ of current-bias capacitance $C_{CB}$ be selected to provide a fast response without resulting in instability. The time constant $\tau_{Ccb}$ (measured in units of time) may be calculated as:

$$\tau_{Ccb} = \frac{C_{Ccb}}{g_{mCcb}} \qquad (4)$$

where $C_{Ccb}$ is the capacitance of current-bias capacitance $C_{CB}$ and $g_{mCcb}$ is the transconductance providing the charge/discharge current for $C_{CB}$.

The time constant $\tau_{Ccb}$ must be large enough to provide the appropriate response. The time constant $\tau_{Ccb}$ may be increased by decreasing the value of the transconductance $g_{m1}$ of transconductance amplifier GM1, which provides the charge and discharge currents to capacitance $C_{CB}$. However, there is a lower limit of $g_{m1}$ below which noise becomes unacceptably high. Another possibility is to increase the value of capacitive $C_{Ccb}$. Unfortunately, the frequencies of interest (e.g., $1/T_{INPUT}$ or 3.3 KHz) require a relatively large capacitance that may not be integrated practically.

The present invention overcomes the foregoing problems associated with increasing the time constant $\tau_{Ccb}$ by employing an inventive sample-and-hold technique. Sample timer 12 and sample gate 30 sample and hold the output of transconductance amplifier GM1 so that the transconductance $g_{mCcb}$ input to capacitance $C_{CB}$ is reduced to $$g_{mCcb} = g_{m1} \times \frac{T_{SAM}}{T_{INPUT}} \qquad (5)$$

Thus, the time constant of $C_{CB}$, $\tau_{Ccb}$, is increased to:

$$\tau_{Ccb} = \frac{C_{Ccb}}{\left(\dfrac{T_{SAM}}{T_{INPUT}}\right) g_{m1}} \qquad (6)$$

or $$\tau_{Ccb} = \frac{C_{Ccb}}{g_{m1}} \times \frac{T_{INPUT}}{T_{SAM}} \qquad (7)$$

As equation (7) makes clear, the "effective" capacitance of $C_{Ccb}$ may be expressed as $C_{eff} = C_{Ccb}(T_{INPUT}/T_{SAM})$. In other words, the necessary value (and therefore size) of current-bias capacitance $C_{CB}$ is reduced by a factor of $T_{SAM}/T_{INPUT}$; accordingly, $C_{CB}$ may be reduced to a integrable size while maintaining the appropriate time constant $\tau_{Ccb}$.

Without the inventive sample-and-hold technique, the value of $C_{CB}$ would have to be adjustable to allow for different input frequencies. Fortunately, the inventive sample-and-hold technique eliminates the need to provide a variable capacitance. Substituting $1/T_{INPUT}$ in equation (6) with the input frequency $f_{INPUT}$ shows that the time constant $\tau_{Ccb}$ of bias capacitance $C_{CB}$ is a function of the input frequency $f_{INPUT}$. Stated mathematically, $$\tau_{Ccb} = \frac{1}{f_{INPUT}} \times \frac{C_{Ccb}}{T_{SAM} g_{m1}} \qquad (8)$$

Thus, using the sample-and-hold technique that samples for a fixed time period $T_{SAM}$ and a fixed capacitance $C_{Ccb}$, the time constant $\tau_{Ccb}$ automatically changes with changes in the input frequency $f_{INPUT}$.

Figure 3:
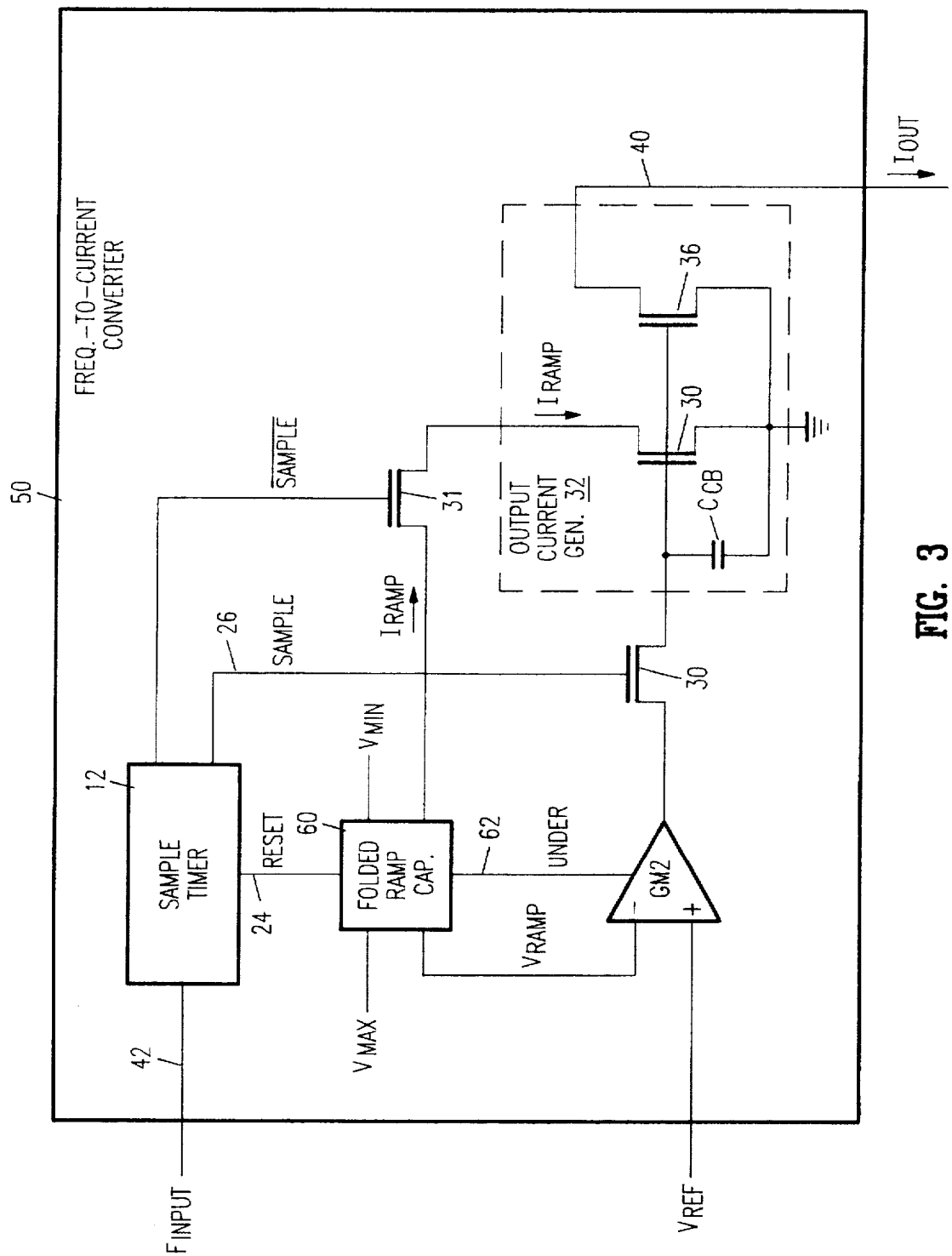
FIG. 3 shows a frequency-to-current converter 50 in accordance with another embodiment of the present invention.

FIG. 3 shows a frequency-to-current converter 50 in accordance with another embodiment of the present invention. To the extent that FIG. 3 is similar to FIG. 1, similar reference numbers are used. Frequency-to-current converter 50 functions in substantially the same way as described above in connection with FIGS. 1 and 2. However, in frequency-to-current converter 50, ramp capacitance $C_{RAMP}$ is replaced by a folded ramp capacitance 60. For simplicity, the optional offset current sources 35 and 37 are not shown in FIG. 3.

In accordance with the embodiment of FIG. 3, ramp capacitance $C_{RAMP}$ is replaced by a folded ramp capacitance 60. As explained below, the process of "folding" allows for the use of a relatively small value of ramp capacitance $C_{RAMP}$, resulting in easier, more economical, integration. Folded ramp capacitance 60 receives as inputs a reference voltage on terminal $V_{MAX}$ and a second reference voltage on a terminal $V_{MIN}$, the voltages on terminals $V_{MAX}$ and $V_{MIN}$ being e.g. 5 volts and 1 volt, respectively. In one embodiment, terminals $V_{MAX}$ and $V_{REF}$ are connected so that the reference voltage on terminal $V_{REF}$ also serves as the reference voltage on terminal $V_{MAX}$.

Capacitance 60 outputs a signal "UNDER" on a line 62 to an input of a transconductance amplifier GM2. Transconductance amplifier GM2 is configured to operate as a conventional differential amplifier when a logic zero (e.g., zero volts) is applied on line 62, and to output its maximum positive output current, regardless of the levels on its differential input terminals (+ and −), when a logic one (e.g., 5 volts) is applied on line 62.

The following explanation describes the concept of "folding" in general, which may be used to increase the time constant of a given capacitance C. In the general case, for a given capacitance C with a constant charging current $I_c$, the time constant $\tau_c$ is proportional to the product of the change in voltage $\Delta V$ and the capacitance C divided by the current $I_c$. This relationship may be expressed mathematically as:

$$\tau_C = \frac{C \Delta V}{I_C} \qquad (9)$$

Thus, for a given time constant $\tau_c$, the necessary value of the capacitance C, and thus the physical area required to integrate such a capacitance, may be minimized by either increasing $\Delta V$ or decreasing the current $I_c$.

Unfortunately, there is a lower limit to the level of current $I_c$ used to charge the capacitance C, for when the current is too low, noise and leakage produce unacceptably poor accuracy in defining the time constant $\tau_c$. Moreover, it is not practical to substantially increase the power supply voltages for integrated circuits to increase the effect of capacitance of a particular capacitance on the integrated circuit. For these reasons, Applicant invented a folding technique that allows for an effective increase in the voltage change $\Delta V$ across ramp capacitance $C_{RAMP}$ without requiring increased voltage potentials. According to this aspect of the invention, the desired voltage range is "folded" into a number of smaller voltage ranges.

Figure 4:
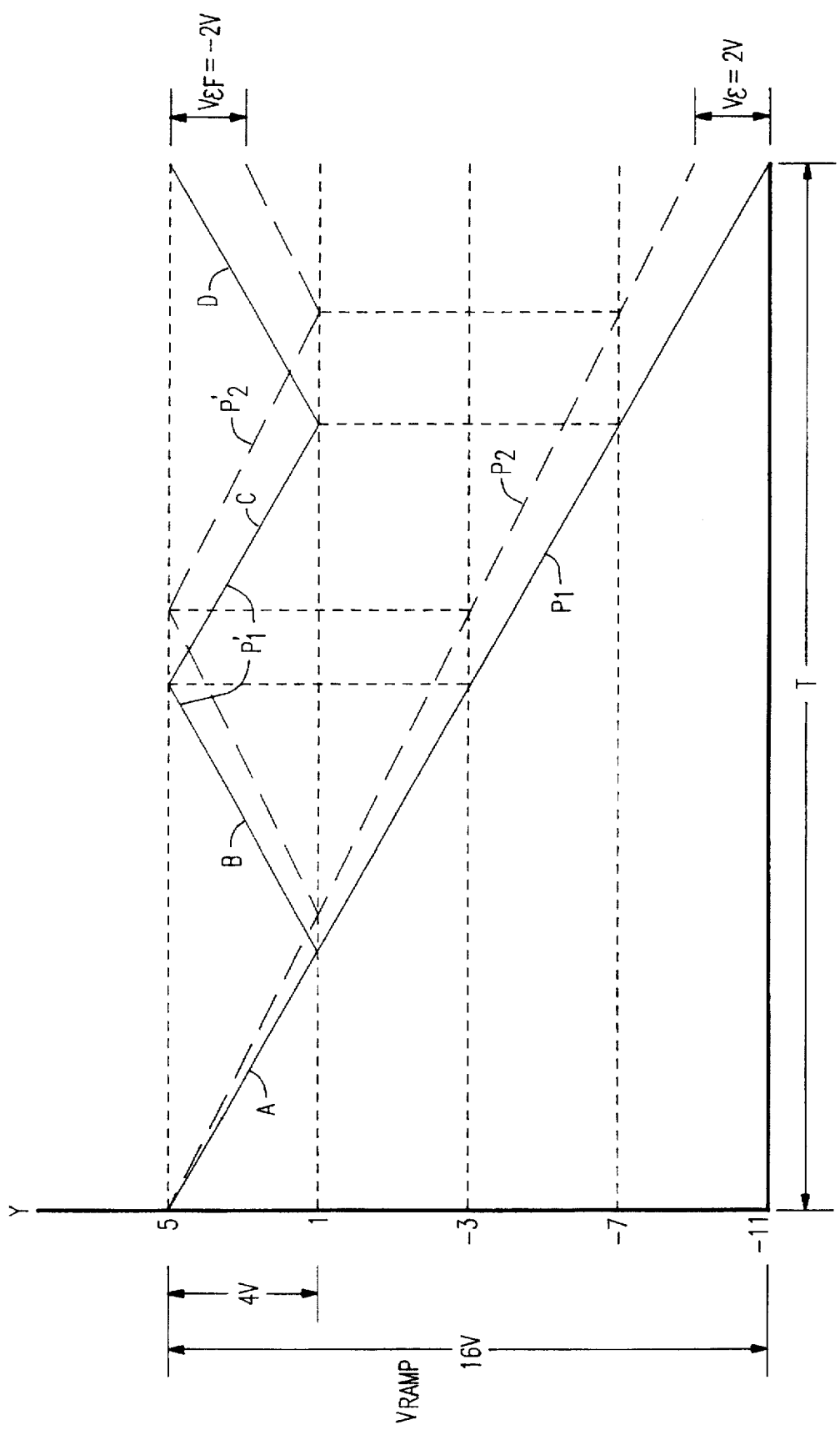
FIG. 4 illustrates the concept of "folding" the voltage range applied across a capacitance.

FIG. 4 illustrates the concept of "folding" the voltage range applied across a capacitance. Paths $P_1$ and $P_2$ are discharge paths similar to the $V_{RAMP}$ discharge paths between times $t_3$ and $t_4$, between times $t_6$ and $t_7$, and between times $t_9$ and $t_{10}$ of FIG. 2. Path $P_1$ shows the voltage across capacitance C discharging at a constant current $I_c$ from 5 volts to −11 volts (for a total $\Delta V$ of 16 volts) over a time period T. Path $P_2$ shows the voltage across capacitance C discharging at a reduced constant current $I_c'$ so that during the period T the capacitance C discharges from 5 volts to −9 volts, for a total $\Delta V$ of only 14 volts. Assuming that the current used to produce path $P_1$ is the desired current, the voltage difference between path $P_1$ and path $P_2$ at the end of period T (i.e., the error voltage $V_e$ of 2 volts) may then be used to provide feedback to trans-conductance amplifier GM2 in the manner described above in connection with transconductance amplifier GM1.

According to the inventive folding technique, the 16-volt range of path $P_1$ may be folded into a number of segments. For example, FIG. 4 shows path $P_1$ folded into a path $P_1'$, which includes four segments, two decreasing and two increasing. The folded path $P_1'$ represents a voltage change $\Delta V$ having an absolute value of 16 volts (i.e., four 4-volt changes) without exceeding 5 volts or going below 1 volt. Similar to path $P_1$, path $P_2$ may be folded into e.g. four segments, two decreasing and two increasing, as shown using path $P_2'$. Importantly, at the end of period T the folded waveform $P_2'$ is off by an error voltage $V_{eF}$ of the same magnitude as the error voltage $V_e$ separating paths $P_1$ and $P_2$.

The error voltage $V_{eF}$ may be used to provide feedback for transconductance amplifier GM2. Note that the error voltage $V_{eF}$ is of the opposite polarity of the voltage $V_e$. For this reason, the inverting and noninverting (− and +) terminals of transconductance amplifier GM2 are reversed in the embodiment of FIGS. 3 and 5 as compared to the terminals of transconductance amplified GM1 of FIG. 1. This and other aspects of the embodiment of FIG. 3 are described below in detail in connection with FIGS. 5 and 6.

Figure 5:
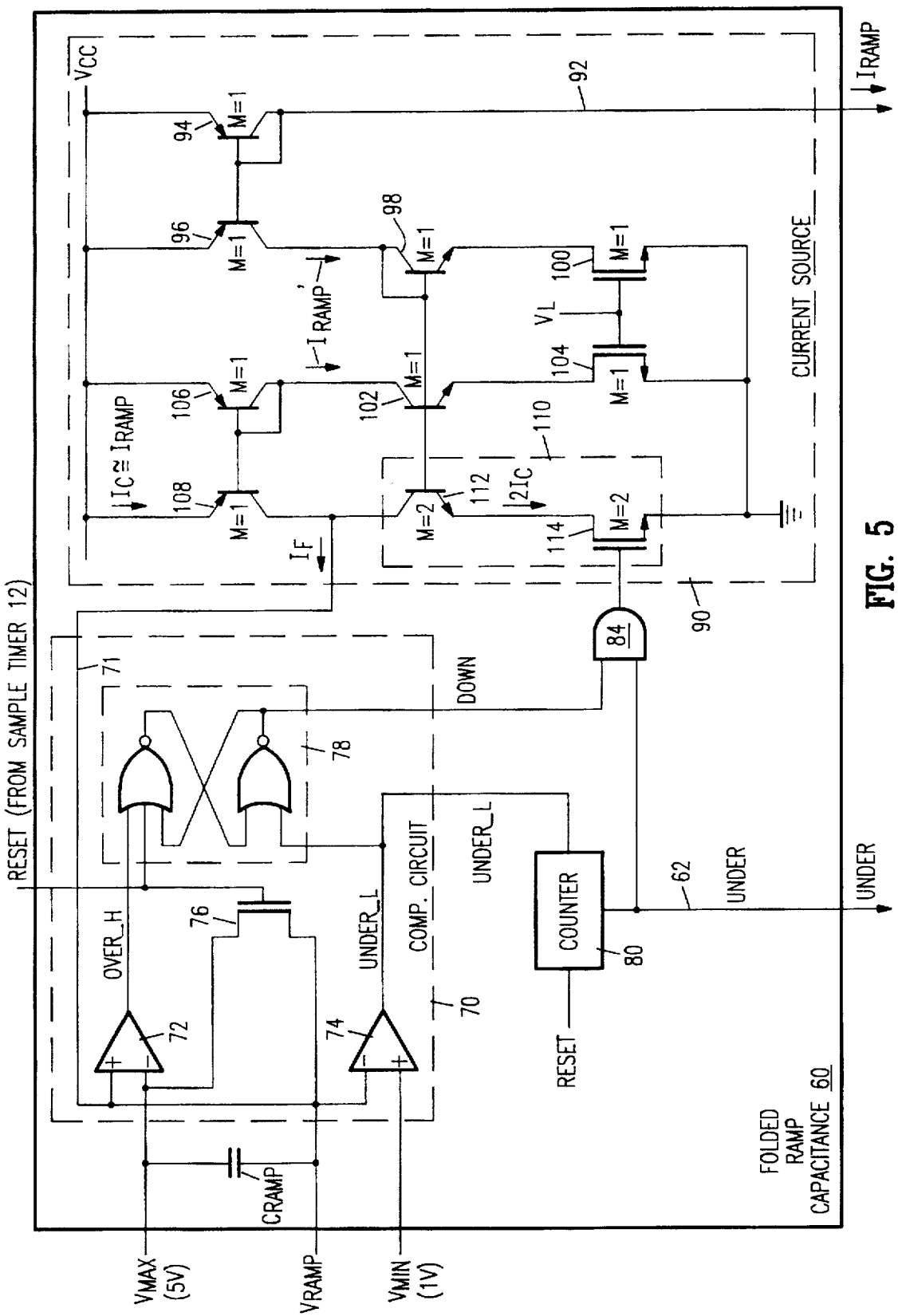
FIG. 5 is a schematic diagram of one embodiment of folded ramp capacitance 60.

FIG. 5 is a schematic diagram of one embodiment of folded ramp capacitance 60. Folded ramp capacitance 60 includes ramp capacitance $C_{RAMP}$, a comparator circuit 70, a counter 80, and a current source 90.

Current source 90 receives the ramp current $I_{RAMP}$ on line 92 from current generator 32 through sample gate 31. The ramp current $I_{RAMP}$ is mirrored by transistors 94 and 96 to provide a current $I_{RAMP}'$ substantially equal to the ramp current IRAMP through series-connected transistors 98 and 100. Transistors 102 and 104 conventionally mirror transistors 98 and 100 so that the current $I_{RAMP}'$ travels through series-connected transistors 96, 98, and 100, and through series-connected transistors 106, 102, and 104. A transistor 108 mirrors transistor 106 so that a current $I_c$ substantially equal to the current $I_{RAMP}'$ through transistor 106 is conducted by the current-handling terminals of transistor 108. Finally, a current source 110, which includes a transistor 112 and a transistor 114, is biased by the combination of transistors 102 and 104.

The pair of transistors 112 and 114 is similar to transistors 102 and 104, except that transistors 112 and 114 have a multiplication factor M of two. Because of the multiplication factor, current source 110 conducts twice as much current for a given bias voltage on the base of transistor 112 as the series connected transistors 102 and 104 (and consequently twice as much current as the current $I_c$ through transistor 108). With this configuration, when transistor 114 is off, the folded ramp current $I_F$ from current source 90 is substantially equal to $I_c$. Conversely, when transistor 114 is conducting, current source 110 conducts a current substantially equal to twice $I_c$ so that the folded ramp current $I_F$ is equal to $I_c - 2I_c = -I_c$. Thus, the folded ramp current $I_F$ may be used to alternately charge and discharge ramp capacitance $C_{RAMP}$ at rates of $I_c$ and $-I_c$, respectively, the direction of folded ramp current $I_F$ depending on whether transistor 114 is on or off.

Comparator circuit 70 receives the folded ramp current $I_F$ on an input line 71. Referring to FIGS. 4 and 5, path $P_1'$ will be used to explain the operation of comparator circuit 70, where the path $P_1'$ represents the changing voltage level on terminal $V_{RAMP}$ of FIGS. 3 and 5.

Referring to FIG. 5, if we assume that the reset terminal RESET of counter 80 was just supplied a positive (e.g., 12-volt) pulse, the voltage on terminal $V_{RAMP}$ will be reset to 5 volts, as shown at the Y axis of FIG. 4. And, if we assume that the folded ramp current $I_F$ from current source 90 is equal to $-I_c$ (i.e., that transistor 114 is biased on), the voltage on terminal $V_{RAMP}$ will begin to discharge as shown in FIG. 4 as element A.

Comparator circuit 70 includes a maximum-voltage comparator 72, a minimum-voltage comparator 74, a reset transistor 76, and a conventional cross-coupled latch 78. When the voltage on terminal $V_{RAMP}$ on the ramp capacitance $C_{RAMP}$ discharges below $V_{MIN}$, comparator 74 will output a logic one to latch 78, which will consequently output a logic zero to an input of an AND gate 84. For the time being, assume that other input to AND gate 84 from line 62 is a logic one, so that the logic zero from latch 78 will cause AND gate 84 to output a logic zero to the gate of transistor 114, turning transistor 114 off.

With transistor 114 off, the folded ramp current $I_F$ from current source 90 will change from $-I_c$ to $+I_c$, the current through transistor 108. As shown in FIG. 4 as leg B of path $P_1'$, the folded ramp current $I_F$ will begin to charge the ramp capacitance $C_{RAMP}$, thereby increasing the voltage on terminal $V_{RAMP}$.

Next, when the voltage on terminal $V_{RAMP}$ exceeds the voltage on terminal $V_{MAX}$ (5 volts in this case), comparator 72 will output a logic one to latch 78 causing latch 78 to output a logic one to transistor 114. As a result, transistor 114 and transistor 112 will conduct twice as much current ($2I_c$) as transistor 108 ($I_c$), so that the folded ramp current $I_F$ of current source 90 will return to $-I_c$. Ramp capacitance $C_{RAMP}$ will consequently begin to discharge, resulting in the steady decrease in the voltage on terminal $V_{RAMP}$ shown as leg C of path $P_1'$ in FIG. 4.

As long as there is a ramp current $I_{RAMP}$ through line 92, there will be a folded ramp current $I_F$ that is either charging or discharging ramp capacitance $C_{RAMP}$. In the case of path $P_1'$, the voltage on terminal $V_{RAMP}$ of ramp capacitance $C_{RAMP}$ is shown to discharge to 1 volt twice (legs A and C) and charge to 5 volts twice (legs B and D).

Counter 80 is connected to comparator circuit 70 on line UNDER_L, which stands for "under low," indicating that the voltage on terminal $V_{RAMP}$ is under the minimum voltage on terminal $V_{MIN}$. The under-low pulses on line UNDER_L to counter 80 allow counter 80 to count the number of times the changing ramp voltage on terminal $V_{RAMP}$ transitions from negative-going to positive-going, thereby providing an indication of the number of "folds." Once the count received by counter 80 goes above a predetermined number, counter 80 outputs a logic zero on output line 62 to transconductance amplifier GM2 and to AND gate 84.

Figure 6:
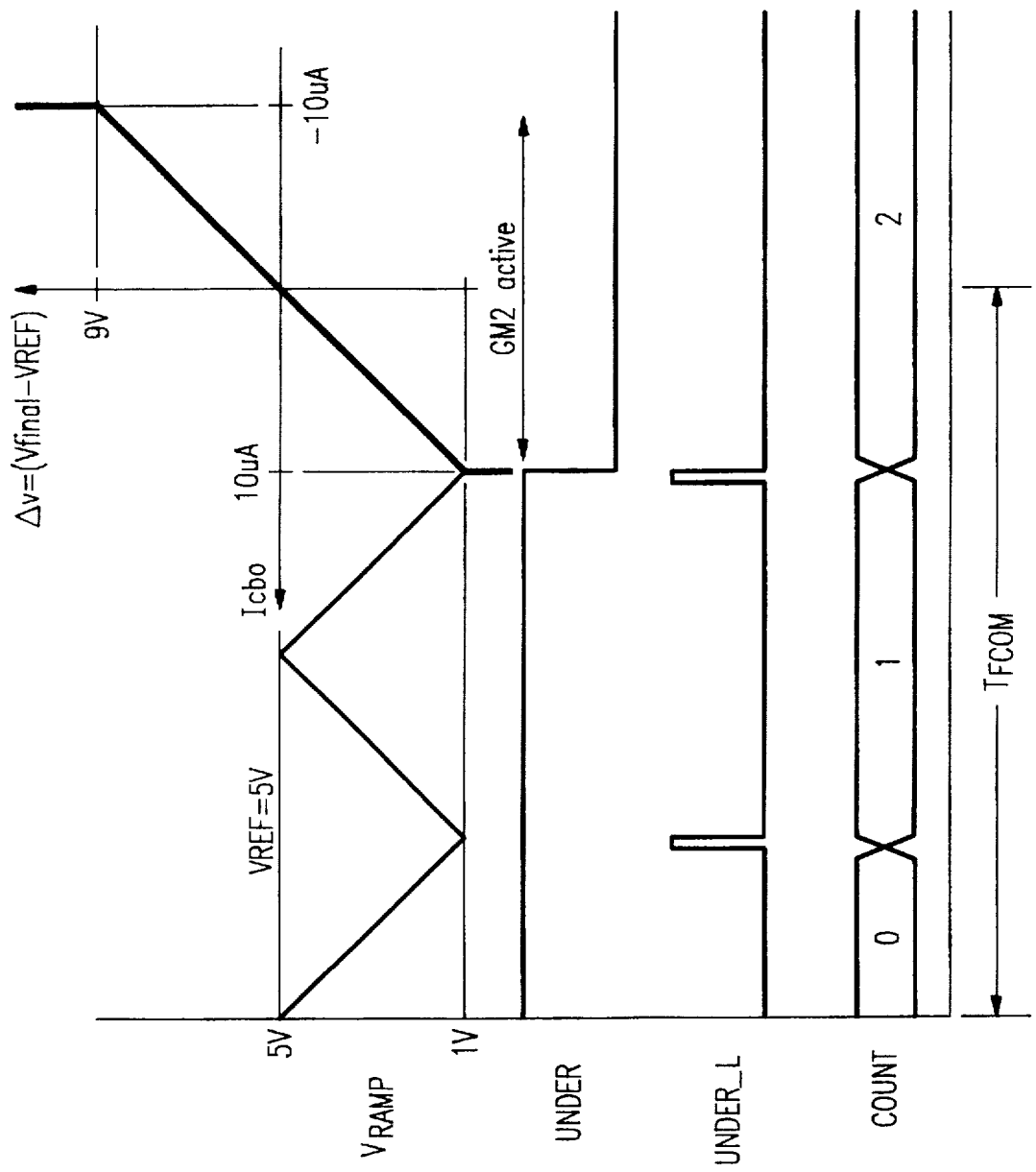
FIG. 6 shows various waveforms associated with a "folded" capacitance.

FIG. 6 is similar to FIG. 4 in that FIG. 6 illustrates an example where the voltage across ramp capacitance $C_{RAMP}$ is folded four times. The voltage $V_{RAMP}$ on ramp capacitance $C_{RAMP}$ transitions from 5 volts to 1 volt and then from 1 volt to 5 volts as described above in connection with FIG. 4. Each time the voltage transitions from negative-going to positive-going, comparator 74 of comparator circuit 70 outputs a positive pulse on line UNDER_L. This positive pulse increments the count stored in counter 80.

In the example of FIG. 6, counter 80 is configured to output a logic zero on line 62 only after the count is equal to two. In other words, as long as the count is "under" two, counter 80 will output a logic one as the signal UNDER on line 62.

If the ramp current $I_{RAMP}$ is far too low for a given input frequency, the folded ramp current $I_F$ of current source 90 will also be too low. In such a case, counter 80 will not reach a count of two during one period of the input signal. In such a case, counter 80 will output a logic one on line 62, which will deactivate GM2 so that GM2 will not respond to its positive and negative inputs, but will instead output its maximum output current of, for example, 10uA. Thus, when the output current $I_{OUT}$ is far lower than is appropriate for a given input frequency, transconductance amplifier GM2 outputs a maximum current to charge bias capacitance $C_{CB}$.

As the value of the output current $I_{OUT}$ (and therefore the ramp current $I_{RAMP}$) increases to more accurately reflect the input frequency, the transition time of the ramp voltage on terminal $V_{RAMP}$ will continue to decrease until the counter reaches a count of two prior to the end of one period $T_{INPUT}$ of the input signal. This case is shown in FIG. 6. Once counter 80 reaches a count of two, counter 80 outputs a zero on line 62, which activates transconductance amplifier GM2. Transconductance amplifier GM2 than responds to its inverting and non-inverting inputs. The active region of transconductance amplifier GM2 is illustrated in FIG. 6 as "GM2 active."

Once GM2 is active, frequency-to-current converter 50 works in substantially the same way as described above in connection with frequency-to-converter 10. If at the end of the period $T_{INPUT}$ of the input signal the ramp voltage on terminal $V_{RAMP}$ is higher than the reference voltage on terminal $V_{MAX}$, transconductance amplifier GM2 draws some charge from bias capacitance $C_{CB}$ during the sample period $T_{SAM}$, thus decreasing the ramp current $I_{RAMP}$ (and consequently decreasing the folded ramp current $I_F$). Conversely, if GM2 is in the active region and the ramp voltage on terminal $V_{RAMP}$ is below the reference voltage on terminal $V_{MAX}$ at the end of the period $T_{INPUT}$, then the active transconductance amplifier GM2 will output current to charge bias capacitance $C_{CB}$ through sample gate 30 during the sample period $T_{SAM}$.

Using a folding factor of four, the embodiment described in connection with FIG. 6 increases the effective capacitance of ramp capacitance $C_{RAMP}$ by a factor of four of course, the voltage across ramp capacitance $C_{RAMP}$ can be folded any number of times. For example, FIG. 7 shows various waveforms associated with folded ramp capacitance 60 in an embodiment that multiplies the total voltage change across ramp capacitance $C_{RAMP}$ by thirty-two times.

Figure 7:
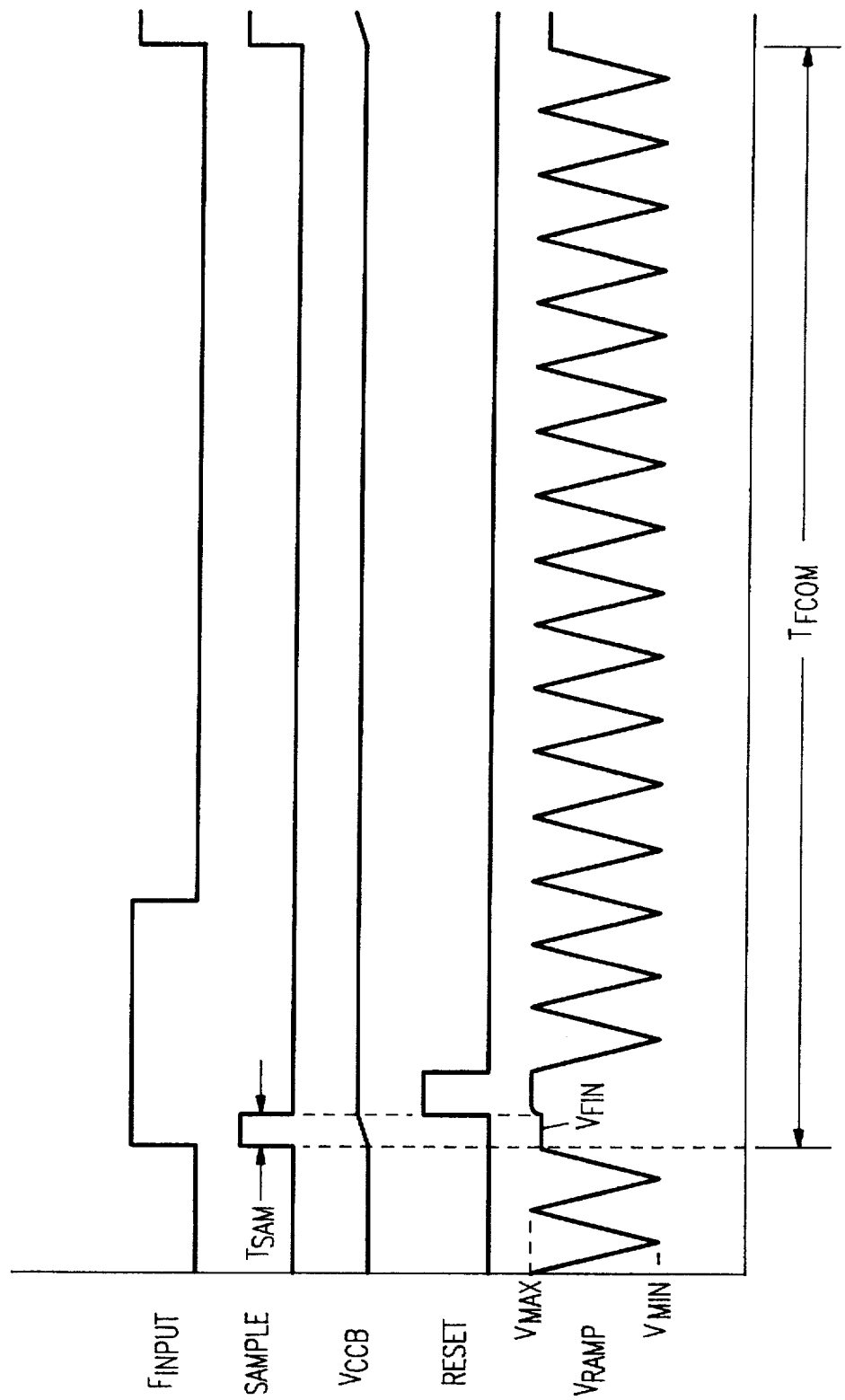
FIG. 7 shows various waveforms associated with folded ramp capacitance 60.

During the sample period $T_{SAM}$ of FIG. 7, the voltage on terminal $V_{RAMP}$ is slightly less than the reference voltage on terminal $V_{MAX}$. As a result, transconductance amplifier GM2 provides an output current to bias capacitance $C_{CB}$, thereby increasing the bias voltage on terminal $V_{CCB}$. Then, during the subsequent reset pulse, the positive reset voltage on the gate of transistor 76 of comparator circuit 70 (see FIG. 5) resets the voltage on terminal $V_{RAMP}$ to the voltage on terminal $V_{MAX}$. Once reset, the voltage $V_{RAMP}$ transitions back and fourth between the voltage on terminal $V_{MAX}$ and the voltage on terminal $V_{MIN}$ approximately 32 times before the next sample pulse.

In the case of FIG. 7, counter 80 would be configured to activate GM2 after a count of 16. If counter 80 did not sense 16 negative to positive transitions between input pulses, counter 80 would output a logic one on line 62, indicating that the count was "under," causing transconductance amplifier GM2 to output the maximum available current to bias capacitance $C_{CB}$.

If the folded ramp current $I_F$ were far too high relative to the input frequency, the transitions of the ramp voltage on terminal $V_{RAMP}$ would occur far more rapidly, causing counter 80 to reach its maximum count and activate transconductance amplifier GM2 well before the end of the period $T_{INPUT}$. When this happens, the signal from counter 80 on line 62 goes low, causing AND gate 84 to disable transistor 114, consequently disabling the folding action of folded ramp capacitance 60. As a result, the voltage on terminal $V_{RAMP}$ will continue to climb beyond the reference voltage on terminal $V_{MAX}$ (to a maximum voltage of e.g. 4 volts above $V_{MAX}$, or 9 volts), as shown in FIG. 6. Transconductance amplifier GM2 will then output a current to decrease the ramp current $I_{RAMP}$ in much the same way as described above in connection with FIG. 3. After a number of periods of the input signal, the final voltage on terminal of $V_{RAMP}$ after a single input period $T_{INPUT}$ will be precisely equal to the voltage on terminal $V_{MAX}$.

Figure 8:
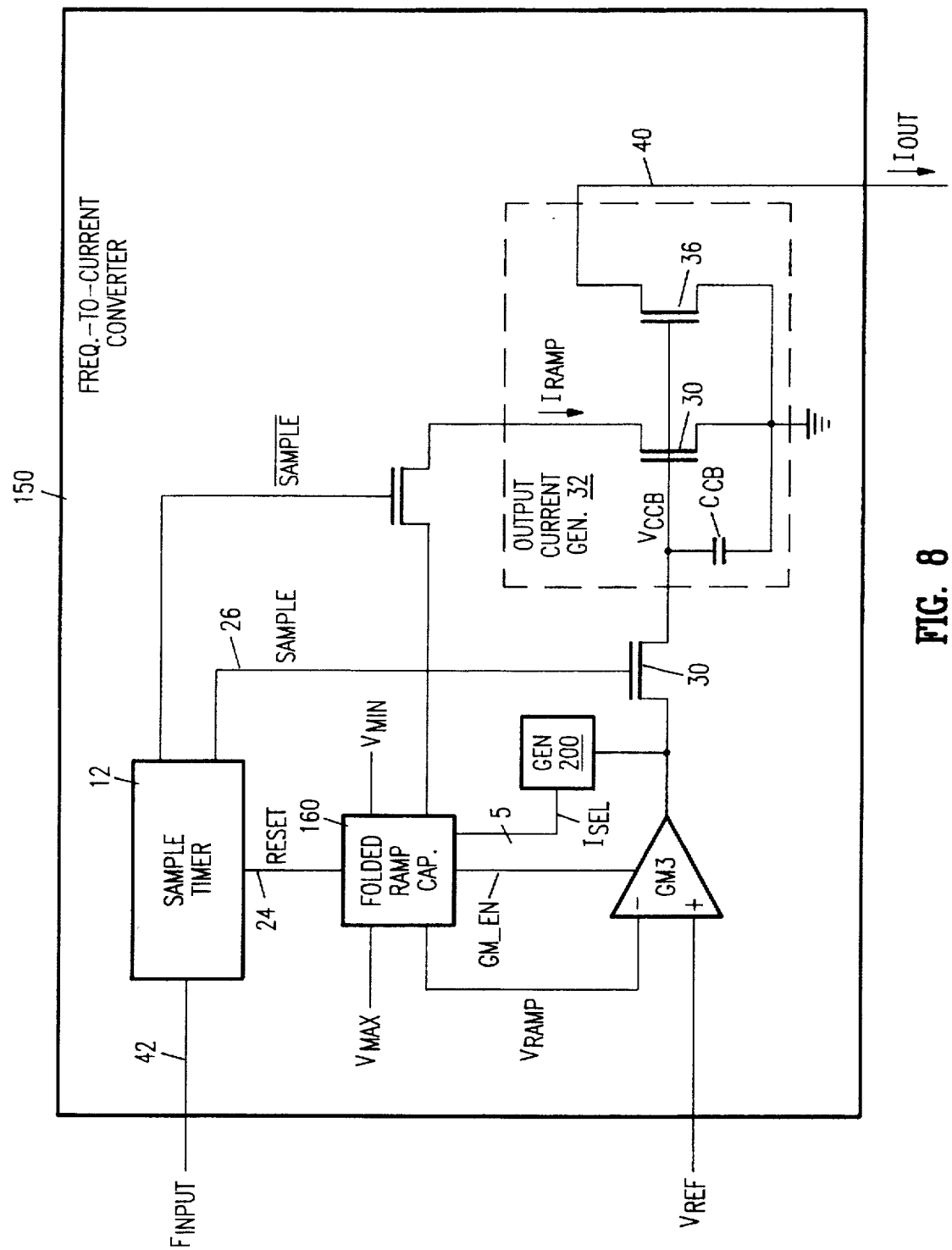
FIG. 8 shows a frequency-to-current converter 150 in accordance with yet another embodiment of the present invention.

FIG. 8 is a schematic diagram of yet another embodiment of the present invention—frequency-to-current converter 150—wherein the settling time of the output current $I_{OUT}$ is improved by the addition of a variable current generator 200 and associated circuitry. The schematic of FIG. 8 is similar to that of FIG. 3, like elements having the same reference numbers.

Figure 9:
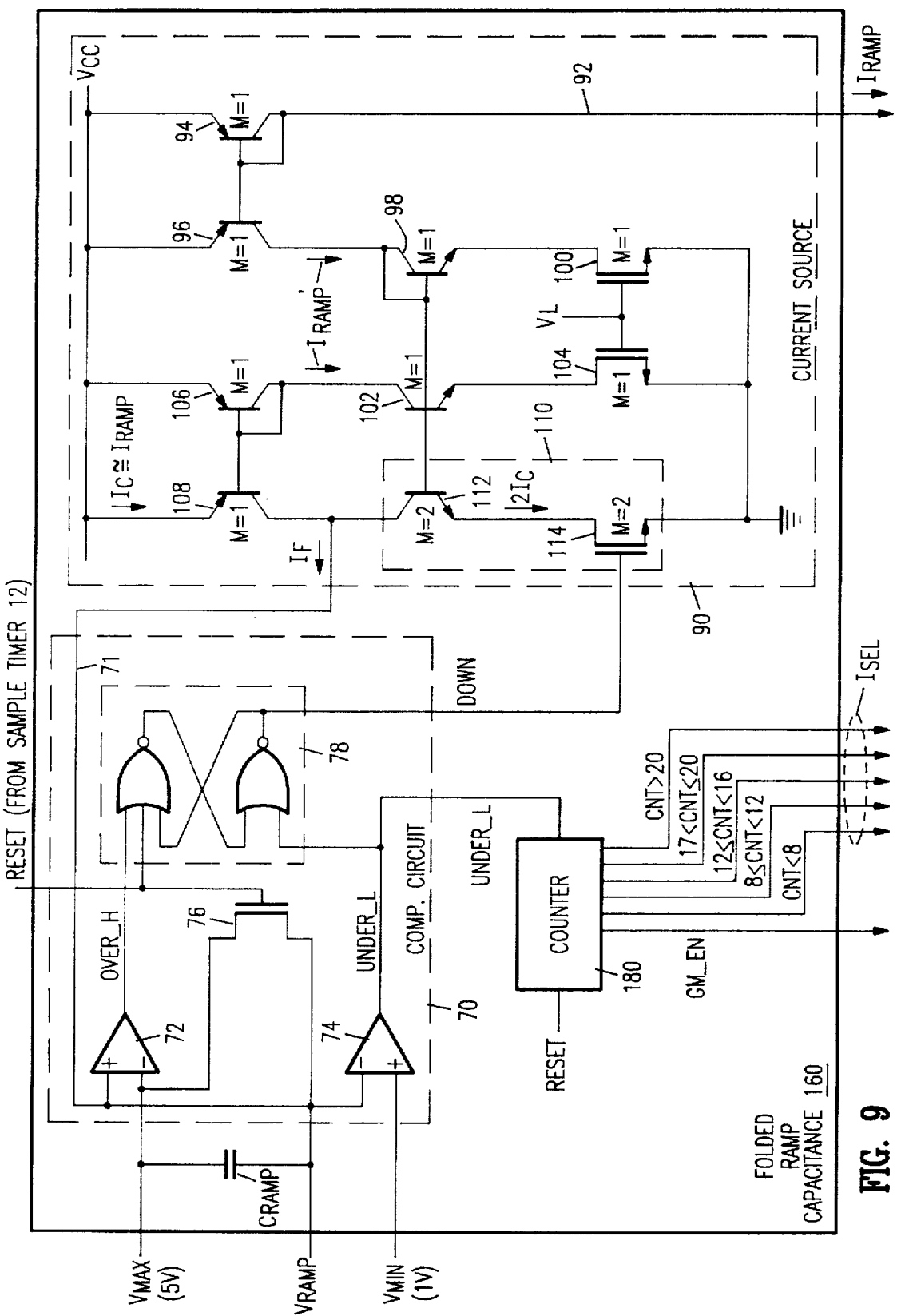
FIG. 9 is a schematic diagram of a folded ramp capacitance 160.

A folded ramp capacitance 160 is connected to a transconductance amplifier GM3 via a GM-enable line GM_EN and to current generator 200 via a current-select bus $I_{SEL}$, which includes lines CNT<8, 8≦CNT<12, 12≦CNT<16, 17<CNT≦20, and CNT>20 (shown in FIG. 9).

FIG. 9 is a schematic diagram of a folded ramp capacitance 160 that is similar to folded ramp capacitance 60 of FIG. 5, like elements having the same reference numbers. When the count stored in a counter 180 is less than eight, counter 180 outputs a logic one on line CNT<8 of bus $I_{SEL}$. Similarly, when the stored count is from eight to eleven, twelve to fifteen, eighteen to twenty, or greater than twenty-one, counter 180 outputs a logic one on the corresponding one of lines 8≦CNT<12, 12≦CNT<16, 17<CNT≦20, and CNT>20, respectively. When the stored count is sixteen or seventeen, a logic one on line GM_EN enables transconductance amplifier GM3 to function in the active mode, as described above for transconductance amplifier GM2 in connection with FIG. 6.

Current generator 200 of FIG. 8 is conventionally configured to output a current of:

1. 1 mA when the voltage on line CNT<8 represents a logic one;
2. 100 μA when the voltage on line 8≦CNT<12 represents a logic one;
3. 10 μA when the voltage on line 12≦CNT<16 represents a logic one;
4. −100 μA when the voltage on line 17<CNT≦20 represents a logic one; and
5. −1 mA when the voltage on line CNT>20 represents a logic one.

Thus configured, the current used to charge and discharge bias capacitance $C_{CB}$ in frequency-to-current converter 150 varies depending on the count stored in counter 180. That is, when the voltage on terminal $V_{CCB}$ is relatively far from that required to provide the correct output current $I_{out}$, the charge or discharge current used to correct the voltage on terminal $V_{CCB}$ is increased. Then, as the voltage on terminal $V_{CCB}$ approaches the appropriate fixed voltage $V_{FIXED}$ during the sample period $T_{SAM}$, the charge or discharge current decreases. In this way, frequency-to-current converter 150 improves the settling time of ramp current $I_{RAMP}$ while maintaining stability.

Frequency-to-current converters in accordance with the present invention are not limited to the particular applications described above. For example, in one embodiment, sample gate 31 of FIG. 3 is eliminated by connecting line $\overline{\text{SAMPLE}}$ directly to the gate of transistor 104 and, through an additional input (not shown) of AND gate 84, to the gate of transistor 114. Furthermore, frequency-to-current converters that do not require the level of precision provided by the "active" analog mode of the second embodiment could rely only on the count stored in counter 80 to determine the output current level. Therefore, the scope of the appended claims should not be limited to the description of the preferred versions described herein.

I claim:

1. A frequency-to-current converter comprising:
   an input node for receiving an input signal having an input frequency;
   a sample timer connected to the input node, the sample timer for providing a sample signal on a sample terminal and a reset signal on a reset terminal;
   a ramp capacitance circuit having a ramp capacitance, the ramp capacitance including a first terminal and a second terminal, the second terminal switchably connected to a first reference voltage, in response to the reset signal from the sample timer;
   a transconductance amplifier having an input terminal connected to the second terminal of the ramp capacitance and an output terminal, the transconductance amplifier providing an output current on the amplifier output terminal;
   a sample gate having a first current-handling terminal connected to the amplifier output terminal, a control terminal connected to the sample terminal of the sample timer, and a second current-handling terminal, the sample gate providing a conductive path between the first and second current-handling terminal in response to the sample signal;
   a current-bias capacitance having a first terminal connected to the second current-handling terminal of the sample gate and a second terminal connected to a second reference voltage; and
   a voltage-to-current converter having a control terminal connected to the first terminal of the current-bias capacitance, the voltage-to-current converter providing a ramp current proportional to a voltage level on the control terminal of the voltage-to-current converter.

2. The converter of claim 1, further comprising a second voltage-to-current converter having a second control terminal connected to the first terminal of the current-bias capacitance and having a second output terminal, the second voltage-to-current converter providing an output current proportional to the voltage level on the first terminal of the current-bias capacitance.

3. The converter of claim 1, wherein the output current from the transconductance amplifier has an amplitude proportional to a voltage level on the input terminal of the transconductance amplifier.

4. The converter of claim 1, wherein the input terminal of the transconductance amplifier is one of first and second differential input terminals, and wherein the other of the first and second differential input terminals is connected to a fixed voltage.

5. The converter of claim 1, wherein the ramp capacitance circuit further comprises:
   a current source having a first terminal connected to the second terminal of the ramp capacitance and a second terminal, the current source for alternately charging and discharging the ramp capacitance; and
   a comparator circuit having a first input terminal connected to a third reference voltage, a second input terminal connected to a fourth reference voltage, and a comparator-circuit output terminal connected to the second terminal of the current source, the comparator circuit providing a first output on the comparator-circuit output terminal when the voltage on the first terminal of the ramp capacitance goes above the third reference voltage, thereby causing the current source to discharge the ramp capacitance, and a second output on the comparator-circuit output terminal when the voltage on the first terminal of the ramp capacitance goes below the fourth reference voltage, thereby causing the current source to charge the ramp capacitance.

6. The converter of claim 5, further comprising a counter having an input terminal connected to the comparator circuit, the counter providing a count representative of a number of times the capacitance is charged and discharged.

7. The converter of claim 6, wherein the counter further comprises an output terminal, and wherein the counter is configured to provide an output signal on the output terminal indicating when the count is below a selected number.

8. The converter of claim 7, wherein the transconductance amplifier further comprises an input-signal-override terminal connected to the output terminal of the counter, and wherein the transconductance amplifier is configured to provide a maximum output current when the output signal on the output terminal of the counter indicates that the count is below the selected number.

9. A method of converting a frequency of a substantially periodic input signal to a reference current having a level proportional to the average period of the input signal, the method comprising:
   receiving the substantially periodic input signal;
   charging a ramp capacitance to a reference voltage level;
   changing the voltage level on the ramp capacitance from the reference voltage level to a finish voltage level at a first voltage-change rate;
   comparing the finish voltage level on the ramp capacitance to a fixed voltage level and, if the first finish voltage level differs from the fixed voltage level, adjusting the first voltage-change rate to a second voltage-change rate; and
   outputting the reference current, which has a level proportional to the average period of the input signal.

10. The method of claim 9, wherein the first and second voltage-change rates are proportional to a voltage on a reference capacitance, and wherein adjusting the first voltage-change rate to the second voltage-change rate comprises changing the voltage on the reference capacitance.

11. The method of claim 9, wherein comparing the finish voltage level on the ramp capacitance to the fixed voltage level includes holding the voltage level across the ramp capacitance constant during a sample period.

12. The method of claim 9, wherein changing the voltage level on the ramp capacitance includes alternately charging and discharging the ramp capacitance.

13. The method of claim 12, wherein the reference voltage and fixed voltage levels are equal.

14. A frequency-to-current converter comprising:

an input node for receiving a substantially periodic input signal;

a ramp capacitance having first and second terminals;

a reset circuit connected to the ramp capacitance, the reset circuit for periodically charging the ramp capacitance to a reference voltage level;

an output current generator connected to one of the first and second terminals of the ramp capacitance, the output current generator for establishing a voltage-change rate for the ramp capacitance, wherein the voltage level on the ramp capacitance changes, at the voltage-change rate, from the reference voltage level to a finish voltage level during a time period proportional to the period of the input signal; and a differential circuit connected to the ramp capacitance and to a fixed voltage level, the differential circuit for adjusting the voltage-change rate in response to a difference between the fixed voltage level and the finish voltage level on the ramp capacitance.

15. A method of converting a frequency of a substantially periodic input signal to a reference current level having a level proportional to the average period of the input signal, the method comprising:

receiving the substantially periodic input signal;

charging a capacitance to a reference voltage level;

discharging the capacitance, at a selected discharge rate, from the reference voltage level to a finish voltage level during a time period proportional to the period of the input signal;

comparing the finish voltage level to a fixed voltage level;

if the finish voltage level is greater than the fixed voltage level, increasing the selected discharge rate; and outputting the reference current, which has a level proportional to the average period of the input signal.

16. A frequency-to-current converter comprising:

an input node configured to receive an input signal having an input frequency;

a ramp capacitance including a first terminal and a second terminal, the second terminal switchably connected to a first reference voltage;

a voltage-to-current converter having an input-voltage terminal and a ramp-current input terminal connected to the second terminal of the ramp capacitance, the voltage-to-current converter configured to provide a ramp-capacitance current proportional to a current-control voltage on the input-voltage terminal;

a current-bias capacitance having a first terminal connected to the input-voltage terminal of the voltage-to-current converter and a second terminal connected to a second reference voltage; and a transconductance amplifier having an amplifier input terminal connected to the second terminal of the ramp capacitance and an output terminal connected to the first terminal of the current-bias capacitance.

17. A frequency-to-current converter comprising:

an input node for receiving a substantially periodic input signal;

a ramp capacitance;

means for setting the capacitance to a reference voltage level;

means for discharging the capacitance, at a selected discharge rate, from the reference voltage to a finish voltage during a time period proportional to the period of the input signal;

means for comparing the finish voltage level to a fixed voltage level;

if the finish voltage level is greater than the fixed voltage level, for increasing the selected discharge rate; and means for providing a current which has a level portional to the average period of the substantially periodic input signal.

* * * * *

UNITED STATES PATENT AND TRADEMARK OFFICE
CERTIFICATE OF CORRECTION

PATENT NO.   : 5,736,879
DATED        : April 7, 1998
INVENTOR(S)  : Pham, Giao M.

It is certified that error appears in the above-identified patent and that said Letters Patent is hereby corrected as shown below:

Column 4, line 63,   delete "$T_8$" and insert --$t_8$--.

Signed and Sealed this

Twenty-ninth Day of September, 1998

Attest:

BRUCE LEHMAN

Attesting Officer

Commissioner of Patents and Trademarks